(12) United States Patent
Hsu et al.

(10) Patent No.: US 6,869,843 B2
(45) Date of Patent: Mar. 22, 2005

(54) NON-VOLATILE MEMORY CELL WITH DIELECTRIC SPACERS ALONG SIDEWALLS OF A COMPONENT STACK, AND METHOD FOR FORMING SAME

(75) Inventors: Fu-Shiung Hsu, Hsinchu (TW); Chen-Chin Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/609,075

(22) Filed: Jun. 27, 2003

(65) Prior Publication Data

US 2004/0262664 A1 Dec. 30, 2004

(51) Int. Cl.$^7$ .......................................... H01L 21/8247
(52) U.S. Cl. ..................... 438/262; 438/265; 438/591; 438/954
(58) Field of Search ................................ 438/261–265, 438/591, 763, 954; 257/314–326

(56) References Cited

U.S. PATENT DOCUMENTS 5,712,180 A * 1/1998 Guterman et al. .......... 438/263
5,836,772 A * 11/1998 Chang et al. ............... 438/261

* cited by examiner

Primary Examiner—Ori Nadav
(74) Attorney, Agent, or Firm—Stout, Uxa, Buyan & Mullins, LLP

(57) ABSTRACT

A disclosed method for forming a non-volatile memory cell includes forming a component stack including an electron trapping layer on a substrate surface. A dielectric layer is formed over the component stack, and a portion is removed such that a remainder of the dielectric layer exists substantially along sidewalls of the component stack. An oxide layer is formed over a bit line in the substrate adjacent to the component stack, and an electrically conductive layer is formed over the component stack and the oxide layer. A described non-volatile memory cell includes a component stack on a substrate surface, the component stack including an electron trapping layer. Multiple dielectric spacers are positioned along sidewalls of the component stack. An oxide layer is positioned over a bit line in the substrate adjacent to the component stack, and an electrically conductive layer is positioned over the component stack and the oxide layer.

16 Claims, 7 Drawing Sheets

NON-VOLATILE MEMORY CELL WITH DIELECTRIC SPACERS ALONG SIDEWALLS OF A COMPONENT STACK, AND METHOD FOR FORMING SAME

BACKGROUND OF THE INVENTION

1. Field of the Invention

The present invention relates to non-volatile memory devices and, more particularly, to localized trapped charge memory cell structures capable of storing multiple bits per cell.

2. Description of Related Art

A non-volatile semiconductor memory device is designed to maintain programmed information even in the absence of electrical power. Read only memory (ROM) is a non-volatile memory commonly used in electronic equipment such as microprocessor-based digital electronic equipment and portable electronic devices such as cellular phones.

ROM devices typically include multiple memory cell arrays. Each memory cell array may be visualized as including intersecting word lines and bit lines. Each word and bit line intersection can correspond to one bit of memory. In mask programmable metal oxide semiconductor (MOS) ROM devices, the presence or absence of a MOS transistor at word and bit line intersections distinguishes between a stored logic '0' and logic '1'.

A programmable read only memory (PROM) is similar to the mask programmable ROM except that a user may store data values (i.e., program the PROM) using a PROM programmer. A PROM device is typically manufactured with fusible links at all word and bit line intersections. This corresponds to having all bits at a particular logic value, typically logic '1'. The PROM programmer is used to set desired bits to the opposite logic value, typically by applying a high voltage that vaporizes the fusible links corresponding to the desired bits. A typical PROM device can only be programmed once.

An erasable programmable read only memory (EPROM) is programmable like a PROM, but can also be erased (e.g., to an all logic '1's state) by exposing it to ultraviolet light. A typical EPROM device has a floating gate MOS transistor at all word and bit line intersections (i.e., at every bit location). Each MOS transistor has two gates: a floating gate and a non-floating gate. The floating gate is not electrically connected to any conductor, and is surrounded by a high impedance insulating material. To program the EPROM device, a high voltage is applied to the non-floating gate at each bit location where a logic value (e.g., a logic '0') is to be stored. This causes a breakdown in the insulating material and allows a negative charge to accumulate on the floating gate. When the high voltage is removed, the negative charge remains on the floating gate. During subsequent read operations, the negative charge prevents the MOS transistor from forming a low resistance channel between a drain terminal and a source terminal (i.e., from turning on) when the transistor is selected.

An EPROM integrated circuit is normally housed in a package having a quartz lid, and the EPROM is erased by exposing the EPROM integrated circuit to ultraviolet light passed through the quartz lid. The insulating material surrounding the floating gates becomes slightly conductive when exposed to the ultraviolet light, allowing the accumulated negative charges on the floating gates to dissipate.

A typical electrically erasable programmable read only memory (EEPROM) device is similar to an EPROM device except that individual stored bits may be erased electrically. The floating gates in the EEPROM device are surrounded by a much thinner insulating layer, and accumulated negative charges on the floating gates can be dissipated by applying a voltage having a polarity opposite that of the programming voltage to the non-floating gates.

Flash memory devices are sometimes called flash EEPROM devices, and differ from EEPROM devices in that electrical erasure involves large sections of, or the entire contents of, a flash memory device.

A relatively recent development in non-volatile memory is localized trapped charge devices. While these devices are commonly referred to as nitride read only memory (NROM) devices, the acronym "NROM" is a part of a combination trademark of Saifun Semiconductors Ltd. (Netanya, Israel).

Each memory cell of a localized trapped charge array is typically an n-channel MOS (nMOS) transistor with an oxide-nitride-oxide (ONO) dielectric structure forming the gate dielectric. Data is stored in two separate locations adjacent to the source and drain terminals of the NMOS transistor, allowing 2 bits of data to be stored in the nMOS transistor structure. The localized trapped charge memory cells are typically programmed by channel hot electron (CHE) injection through bottom oxide layers of the ONO dielectric structures. During programming, electrical charge is trapped in the ONO dielectric structures. The localized trapped charge memory cells are erased by tunneling enhanced hot hole (TEHH) injection through bottom oxide layers of the ONO dielectric structures.

FIGS. 1A and 1B will now be used to illustrate a problem that arises in known localized trapped charge memory cell structures. FIG. 1A is a cross-sectional view of 2 known localized trapped charge memory cell structures 100A and 100B formed on and in a semiconductor substrate 102. The localized trapped charge memory cell structure 10A includes a first oxide-nitride-oxide (ONO) dielectric structure positioned between an electrically conductive gate terminal 104A of a first nMOS transistor structure and 2 buried source/drain regions 106A and 106B. The buried source/drain regions 106A and 106B form interchangeable source and drain regions of the first nMOS transistor structure. The first ONO dielectric structure includes a first silicon dioxide (oxide) layer 108A, a silicon nitride (nitride) layer 110A over the first oxide layer 108A, and a second oxide layer 112A over the nitride layer 1I A.

Similarly, the localized trapped charge memory cell structure 100B includes a second ONO dielectric structure positioned between an electrically conductive gate terminal 104B of a second nMOS transistor structure and 2 buried source/drain regions 106B and 106C. The buried source/drain regions 106B and 106C form interchangeable source and drain regions of the second nMOS transistor structure. The second ONO dielectric structure includes a first silicon dioxide (oxide) layer 108B, a silicon nitride (nitride) layer 110B over the first oxide layer 108B, and a second oxide layer 112B over the nitride layer 110B.

The buried source/drain regions 106A, 106B, and 106C form bit lines of the 2 localized trapped charge memory cell structures 100A and 100B. In a known method for forming the structure of FIG. 1, relatively thick oxide layers 114A, 114B, and 114C are grown over the respective buried source/drain regions 106A, 106B, and 106C to electrically isolate the buried source/drain regions 106A, 106B, and 106C from a word line (not shown) to be formed over the gate terminals 104A and 104B, and the oxide layers 114A, 114B, and 114C.

FIG. 1B illustrates a problem that arises in the known localized trapped charge memory cell structures 100A and 100B of FIG. 1A in that the oxide layers 114A, 114B, and 114C formed over the respective buried source/drain regions 106A, 106B, and 106C encroach into the two areas of the localized trapped charge memory cell structures 100A and 100B where data is stored, reducing data retention time and a maximum number of read/write cycles (i.e., endurance) of the memory cell structures.

FIG. 1B is a magnified view of a portion of FIG. 1A where the oxide layer 108A, the buried source/drain region 106B, and the oxide layer 114B meet. When the oxide layer 114B is grown over the buried source/drain region 106B, a pointed "bird's beak" structure 116 forms at an outer edge of the oxide layer 114B where the oxide layer 108A, the buried source/drain region 106B, and the oxide layer 114B meet. The localized trapped charge memory cell structure 100A stores one bit of data in this area. As shown in FIG. 1B, the bird's beak structure 116 extends a significant distance under a component stack of the localized trapped charge memory cell structure 100A, and can reduce the data retention time and the endurance of the corresponding portion of the localized trapped charge memory cell structure 100A.

It would thus be advantageous to have a localized trapped charge memory cell structure in which bird's beak structures like those shown in FIG. 1B are reduced or eliminated, and a method for forming such localized trapped charge memory cell structures.

SUMMARY OF THE INVENTION

A disclosed method for forming at least one non-volatile memory cell includes forming a component stack of the at least one non-volatile memory cell on a surface of a substrate, wherein the component stack includes an electron trapping layer. A dielectric layer is formed over the component stack, and a portion of the dielectric layer is removed such that a remainder of the dielectric layer exists substantially along sidewalls of the component stack. An oxide layer is formed over a bit line existing in the substrate adjacent to the component stack, and an electrically conductive layer is formed over the component stack and the oxide layer.

A described non-volatile memory cell includes a component stack arranged on a surface of a substrate, wherein the component stack includes an electron trapping layer. Multiple dielectric spacers are positioned along and in contact with sidewalls of the component stack. An oxide layer is positioned over and in contact with a bit line existing in the substrate adjacent to the component stack, and an electrically conductive layer is positioned over and in contact with the component stack and the oxide layer.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1A:
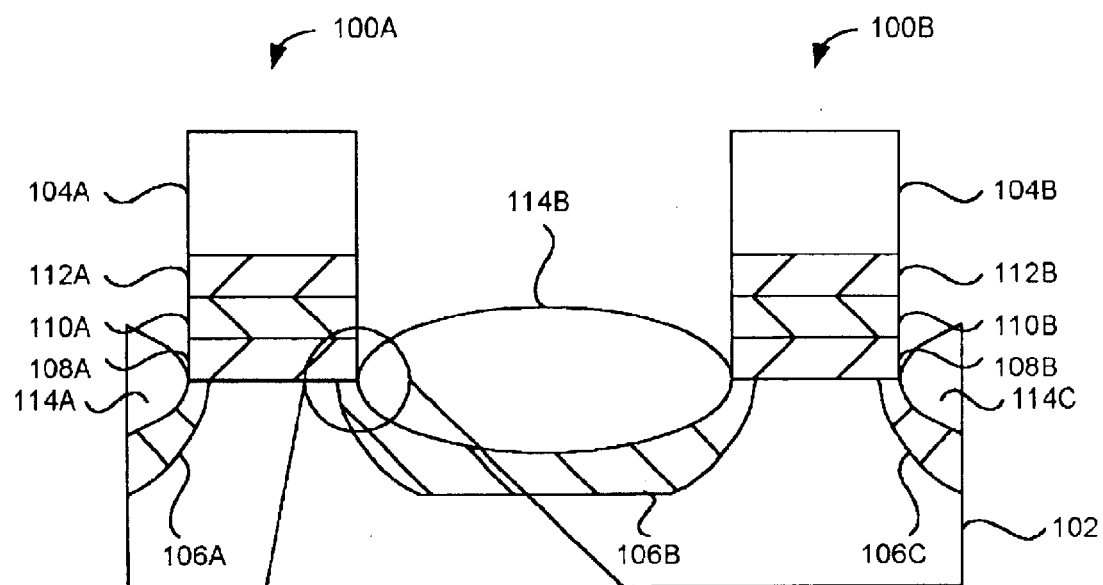
FIG. 1A is a cross-sectional view of 2 known localized trapped charge memory cell structures formed on and in a semiconductor substrate.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of localized trapped charge memory cell structures. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to localized trapped charge memory cell structures and methods of forming such structures.

Figure 2:
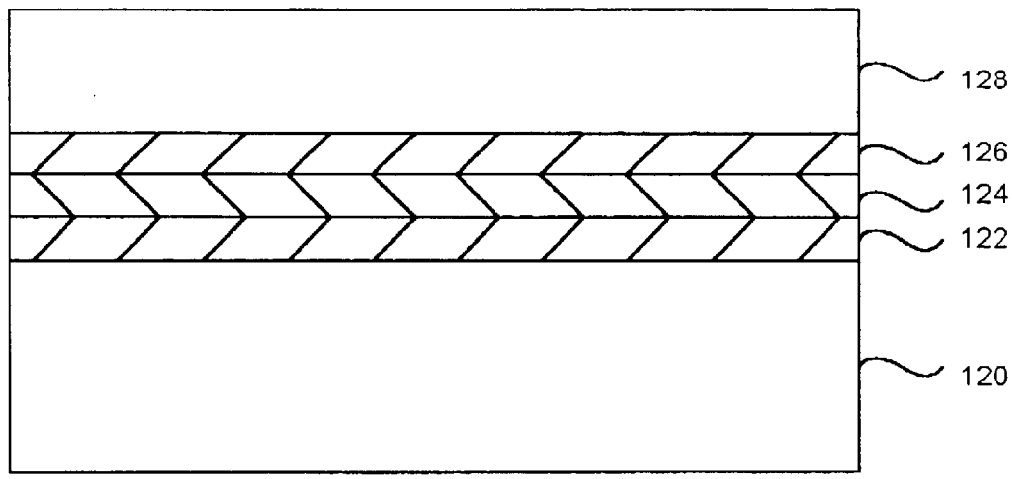
FIG. 2 is a cross-sectional view of a semiconductor substrate having a first silicon dioxide (oxide) layer formed on an upper surface, a silicon nitride (nitride) layer formed over the first oxide layer, a second oxide layer formed over the nitride layer, and a polycrystalline silicon (polysilicon) layer formed over the second oxide layer.

Referring to the drawings, FIGS. 2–9B will now be used to describe one embodiment of a method for forming localized trapped charge memory cell structures. FIG. 2 is a cross-sectional view of a semiconductor substrate 120 having an electron trapping structure comprising a first silicon dioxide (oxide) layer 122 formed on an upper surface, a silicon nitride (nitride) layer 124 formed over the first oxide layer 122, ad a second oxide layer 126 formed over the nitride layer 12. A polycrystalline silicon (polysilicon) layer 128 is formed over the second oxide layer 126.

The semiconductor substrate 120 may be, for example, a semiconductor wafer (e.g., a silicon wafer). The oxide layers 122 and 126 consist substantially of silicon dioxide ($SiO_2$), and may be grown and/or deposited on the upper surface of the semiconductor substrate 120. The nitride layer 124 consists substantially of silicon nitride ($Si_3N_4$), and may be deposited on an upper surface of the oxide layer 122.

The oxide layer 122, the nitride layer 124, and the oxide layer 126 form an oxide-nitride-oxide (ONO) structure. To store data, electrons are trapped in the nitride layer 124 of the ONO structure as described above. The nitride layer 124 is electrically isolated by the oxide layers 122 and 126. The oxide layers 122 and 126 are preferably thick enough that electrons trapped in the nitride layer 124 cannot easily tunnel through the oxide layers 122 and 126. Such tunneling may occur, for example, when the oxide layers 122 and 126 are less than about 50 Angstroms (A) thick. In one embodiment, the oxide layer 122 is grown or deposited to a thickness of between about 50 and 100 A, the nitride layer 124 is deposited to a thickness of between about 35 and 75 A, and the oxide layer 126 is grown or deposited to a thickness of between about 50 and 150 A.

If the oxide layer 126 is grown over the nitride layer 124 rather than deposited, some portion of the nitride layer 124 is consumed in the formation of the oxide layer 126 at a rate of about 1 A of nitride consumed to 2 A of oxide formed. Accordingly, the nitride layer 124 may, for example, be deposited to the desired thickness of 35 to 75 A plus about half the desired thickness of the oxide layer 126. For example, if it is desired for the oxide layer 126 to have a thickness of 150 A, and for the nitride layer 124 to have a thickness of 50 A, then the nitride layer 124 should initially be deposited to a thickness of 125 A (50 A+75 A).

The polysilicon layer 128 may be, for example, deposited on an upper surface of the oxide layer 126 using a chemical vapor deposition (CVD) process. The polysilicon is preferably doped to increase its electrical conductivity. During the doping, dopant atoms (e.g., phosphorus) may be introduced into the polysilicon. The doping may be carried out via a subsequent diffusion process or ion implantation process. Implantation doping of the polysilicon layer 128 may be termed "pocket implantation." It is also possible to dope the polysilicon in-situ during the above described CVD process.

Figure 3:
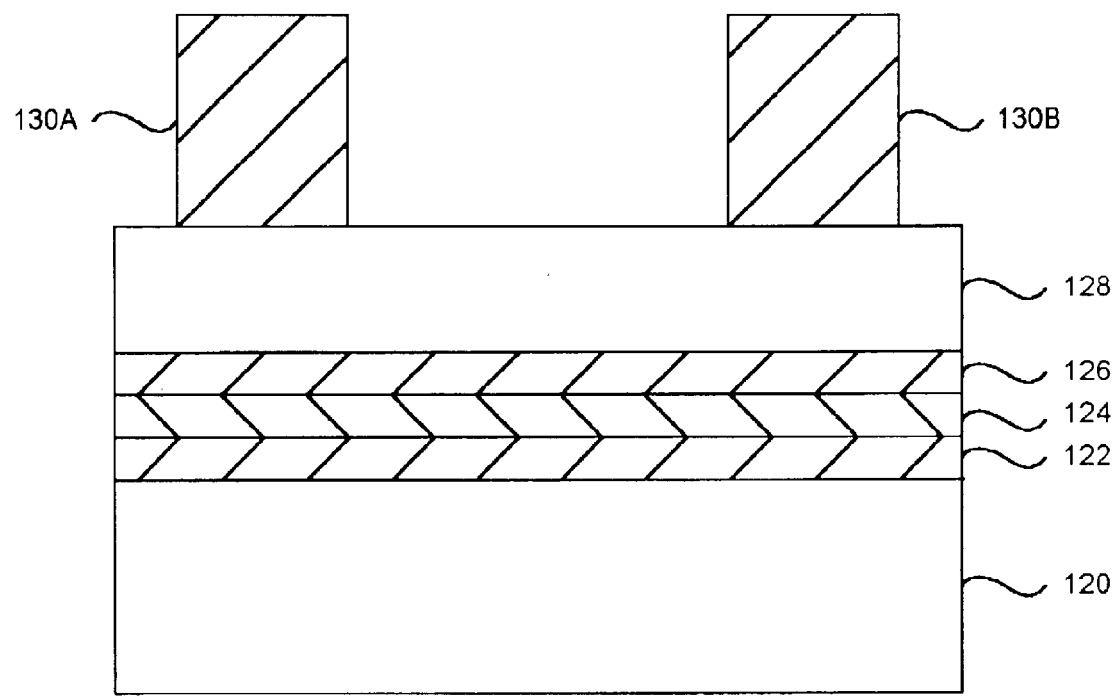
FIG. 3 is the cross-sectional view of FIG. 2 wherein two photoresist features have been formed on an upper surface of the polysilicon layer.

FIG. 3 is the cross-sectional view of FIG. 2 wherein two photoresist features 130A and 130B have been formed on an upper surface of the polysilicon layer 128. A layer of a photoresist material may be formed on the upper surface of the polysilicon layer 128 and patterned via a photolithographic process, leaving the two photoresist features 130A and 13013 on the upper surface of the polysilicon layer 128.

Figure 4:
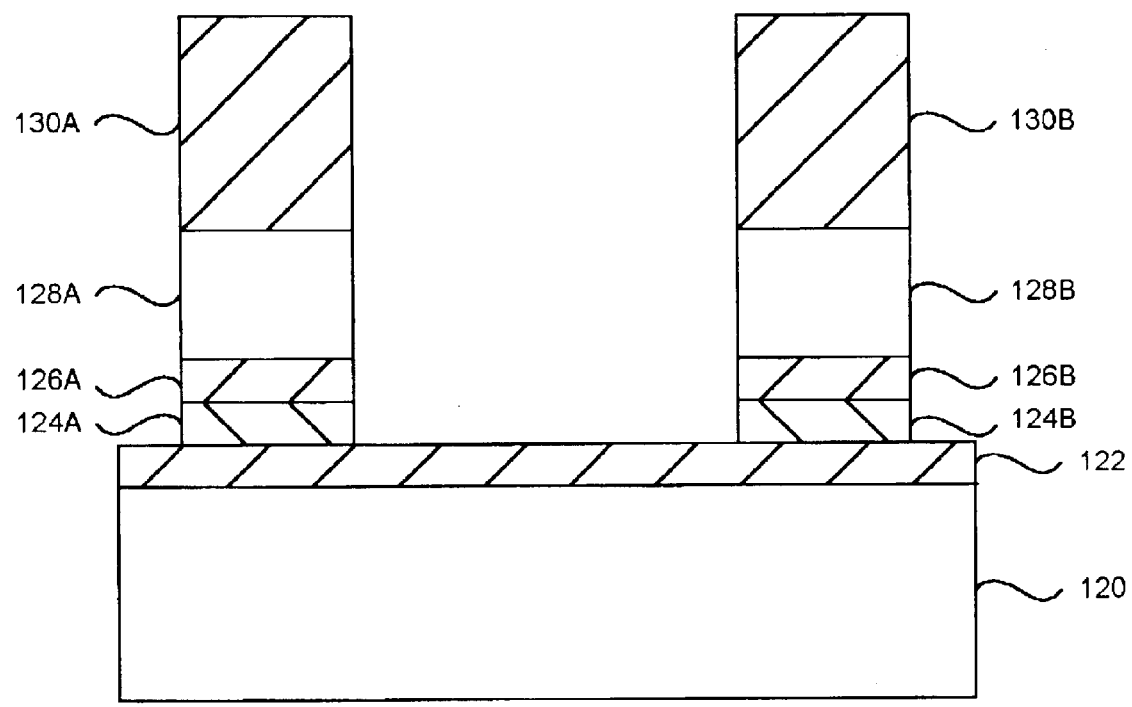
FIG. 4 is the cross-sectional view of FIG. 3 following an etching operation during which the photoresist features are used as etching masks to pattern the underlying polysilicon layer, the second oxide layer, and the nitride layer.

FIG. 4 is the cross-sectional view of FIG. 3 following an etching operation during which the photoresist features 130A and 130B are used as etching masks to pattern the underlying polysilicon layer 128, oxide layer 126, and nitride layer 124. The patterning of the polysilicon layer 128 produces polysilicon layers 128A and 128B. The patterning of the oxide layer 126 produces oxide layers 126A and 126B, and the patterning of the nitride layer 124 produces nitride layers 124A and 124B.

The etching operation may include, for example, multiple etching processes performed in sequence. For example, a first etch process may be a selective etch process (e.g., a dry plasma etch process) in which the selectivity of polysilicon to oxide is high. A second etch process may be a selective etch process (e.g., a dry plasma etch process) in which the selectivity of oxide to nitride is high. A third etch process may be a selective etch process (e.g., a dry plasma etch process) in which the selectivity of nitride to oxide is high. In this situation, following the third etch process, the polysilicon layer 128, the oxide layer 126, and nitride layer 124 have been patterned while the oxide layer 122 is substantially unaffected as shown in FIG. 4.

Figure 5:
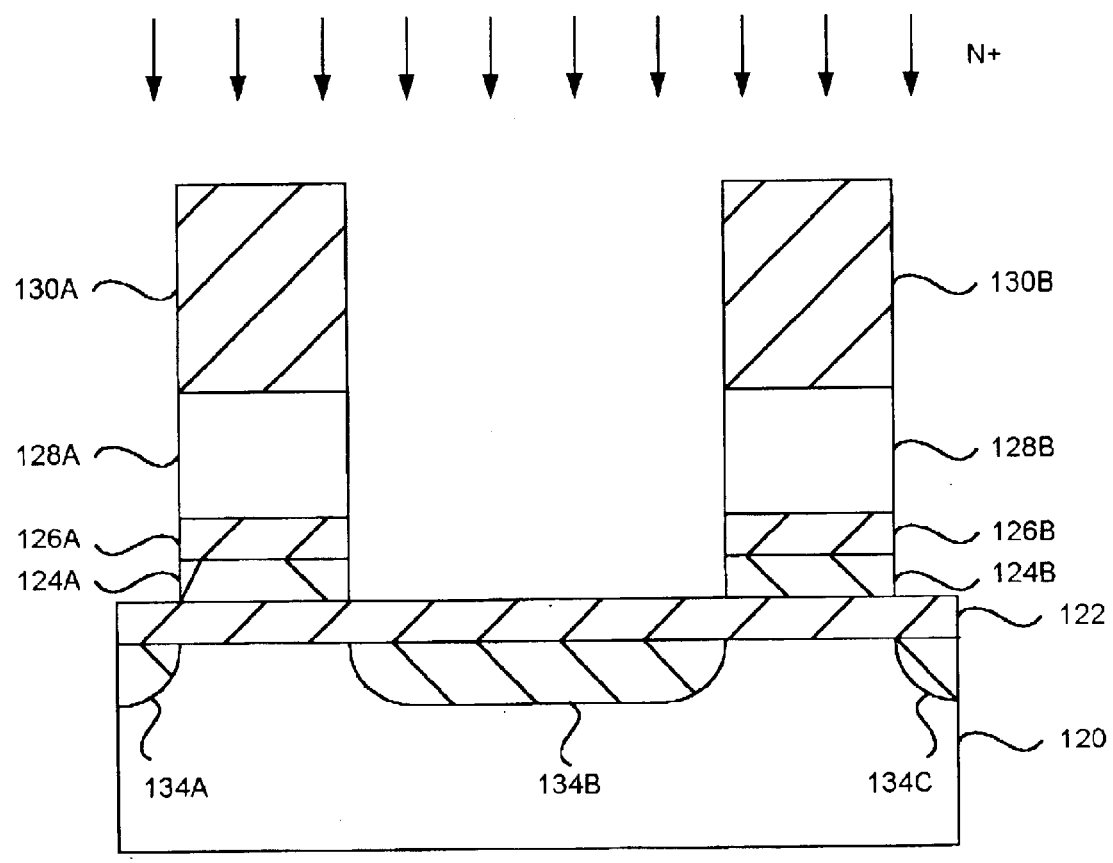
FIG. 5 is the cross-sectional view of FIG. 4 during introduction of n-type dopant atoms (n+) into unprotected areas of the upper surface of the semiconductor substrate.

FIG. 5 is the cross-sectional view of FIG. 4 during introduction of n-type dopant atoms (n+) into unprotected areas of the upper surface of the semiconductor substrate 120. The n-type dopant atoms may be, for example, phosphorus atoms, and may be introduced into the unprotected areas of the upper surface of the semiconductor substrate 120 via chemical diffusion or ion implantation. The semiconductor substrate 120 may then be subjected to a heating operation for drive in (following chemical diffusion) or anneal (following ion implantation).

During the introduction of the n-type dopant atoms, n-type dopant atoms pass through the oxide layer 122 around the structures on the upper surface of the semiconductor substrate 120 and form buried source/drain regions 134A, 134B, and 134C in the semiconductor substrate 120 as indicated in FIG. 5. The buried source/drain regions 134A, 134B, and 134C are thereby advantageously aligned with the structures existing on the upper surface of the semiconductor substrate 120.

Figure 6:
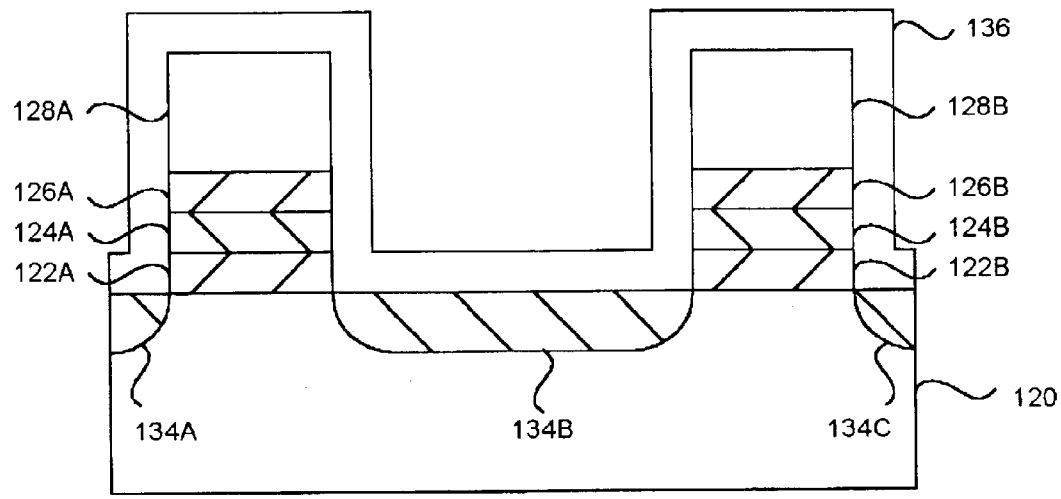
FIG. 6 is the cross-sectional view of FIG. 5 following removal of unprotected portions of the first oxide layer and the photoresist features, and the forming of a third oxide layer over the structures on the upper surface of the semiconductor substrate and over the regions of the upper surface surrounding the structures.

FIG. 6 is the cross-sectional view of FIG. 5 following removal of unprotected portions of the oxide layer 122 and the photoresist features 130A and 130B, and the forming of an oxide layer 136 over the structures on the upper surface of the semiconductor substrate 120 and over the regions of the upper surface surrounding the structures. The portions of the oxide layer 122 surrounding the structures on the upper surface of the semiconductor substrate 120 may be removed via a dry plasma etch process. Following removal of the unprotected portions of the oxide layer 122, the photoresist features 130A and 130B are removed. The photoresist features 130A and 130B may be removed via, for example, an ashing process during which the semiconductor substrate 120 is heated in an oxidizing gaseous atmosphere.

Following removal of the photoresist features 130A and 130B, the oxide layer 136 is formed over the structures on the upper surface of the semiconductor substrate 120 and over the regions of the upper surface surrounding the structures as shown in FIG. 6. The oxide layer 136 is preferably a deposited high temperature oxide (HTO) layer having a thickness of between about 4 and 110 A. The HTO layer may be formed, for example, by placing the semiconductor substrate 120 in a furnace chamber, evacuating the chamber, heating the semiconductor substrate 120 in the chamber, and introducing dichlorosilane (DCS, $SiH_2Cl_2$) and nitrous oxide ($N_2O$) into the chamber as reacting gases.

Figure 7:
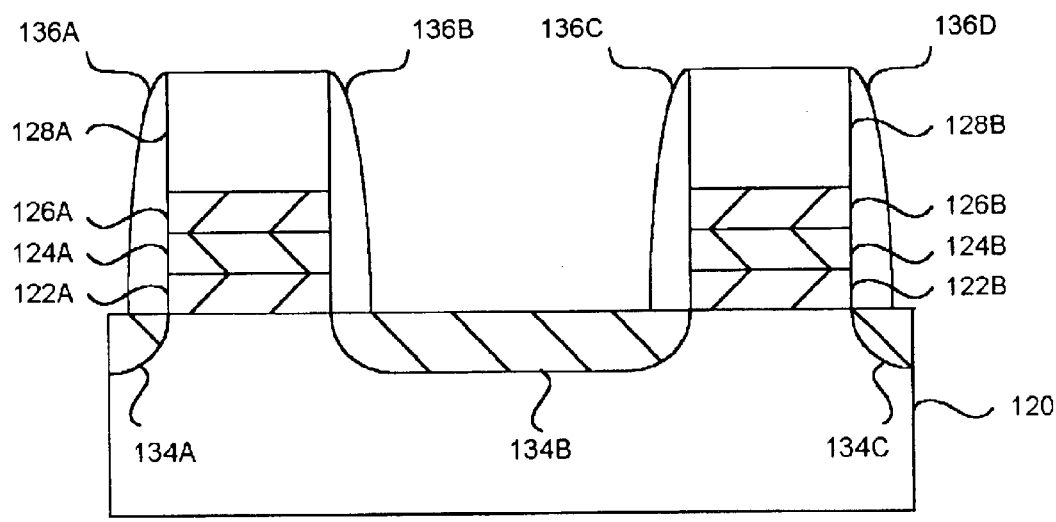
FIG. 7 is the cross-sectional view of FIG. 6 following etching removal of a portion of the third oxide layer to form spacers along sidewalls of component stacks of two localized trapped charge memory cell structures.

FIG. 7 is the cross-sectional view of FIG. 6 following etching removal of a portion of the oxide layer 136 to form spacers 136A–136D on the sidewalls of component stacks of localized trapped charge memory cell structures. A first localized trapped charge memory cell structure includes a component stack having oxide layer 122A, nitride layer 124A, oxide layer 126A, and polysilicon layer 128A. Similarly, a second localized trapped charge memory cell structure includes a component stack having oxide layer 122B, nitride layer 124B, oxide layer 126B, and polysilicon layer 128B. As indicated in FIG. 7, following etching removal of the portion of the oxide layer 136, spacers 136A and 136B are formed on sidewalls 140 of the component stack of the localized trapped charge memory cell structures 138A, and spacers 136C and 136D are formed on sidewalls of the component stacks of the localized trapped charge memory cell structures.

The removed portion of the oxide layer 136 is preferably removed via an anisotropic dry etch process in which oxide is removed from horizontal surfaces of the oxide layer 136 at a faster rate than from vertical surfaces. For example, etchant ions may be directed at the upper surface of the semiconductor substrate 120 at an angle substantially normal to the upper surface. As a result, oxide may be removed from the horizontal surfaces of the oxide layer 136 at a faster rate than from the vertical surfaces, thereby forming the spacers 136A–136D on the sidewalls of the component stacks of the localized trapped charge memory cell structures 138A and 138B as shown in FIG. 7.

Figure 8:
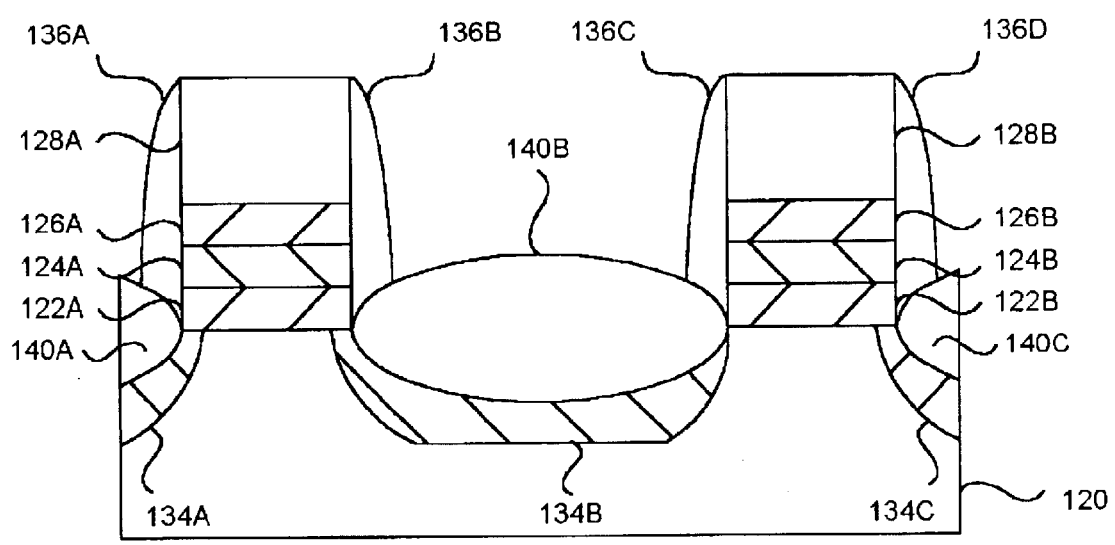
FIG. 8 is the cross-sectional view of FIG. 7 following formation of multiple oxide layers in exposed regions of the upper surface of the semiconductor substrate surrounding the component stacks of the localized trapped charge memory cell structures.

FIG. 8 is the cross-sectional view of FIG. 7 following formation of oxide layers 140A, 140B, and 140C in exposed regions of the upper surface of the semiconductor substrate 120 surrounding the component stacks of the localized trapped charge memory cell structures. While the oxide layers 140A–140C may be deposited, the oxide layers 140A–140C are preferably grown. The oxide layers 140A–140C preferably have a maximum thickness between about 500 A and 1200 A. For example, a dry oxidation process may be used to grow the oxide layers 140A–140C in the exposed regions of the upper surface of the semiconductor substrate 120.

Figure 9A:
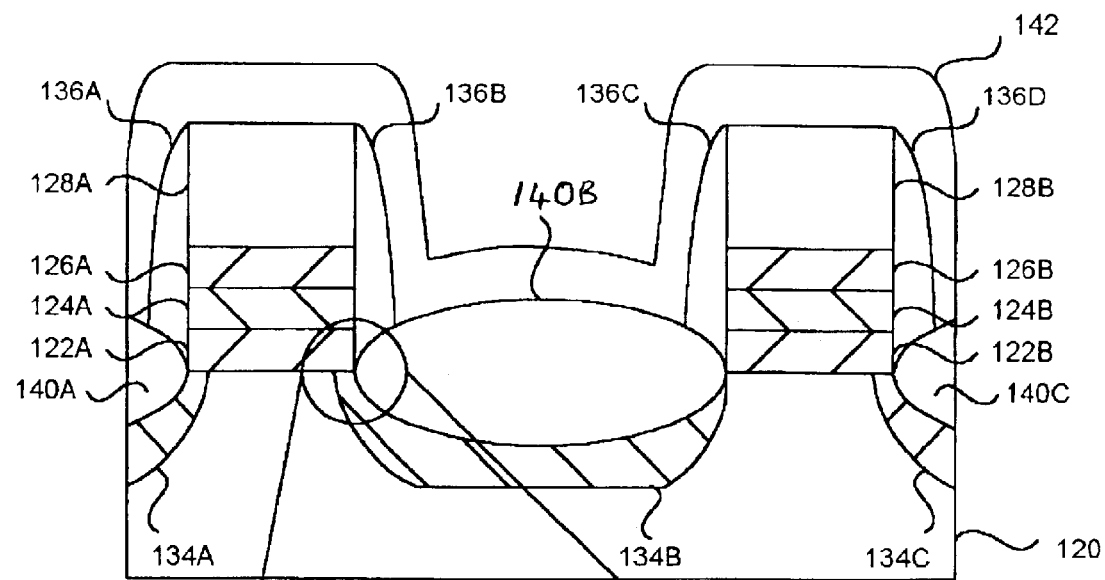
FIG. 9A is the cross-sectional view of FIG. 8 following formation of an electrically conductive layer over the component stacks of the localized trapped charge memory cell structures and the multiple oxide layers.

FIG. 9A is the cross-sectional view of FIG. 8 following formation of an electrically conductive layer 142 over the component stacks of the localized trapped charge memory cell structures and the oxide layers 140A–140C. The electrically conductive layer 142 may be, for example, a metal-silicide layer. In one embodiment the electrically conductive layer 142 is a tungsten silicide layer ($WSi_x$). Metal-silicides such as tungsten silicide are commonly deposited via CVD to form electrically conductive layers.

In FIG. 9A, the localized trapped charge memory cell structure includes a first oxide-nitride-oxide (ONO) dielectric structure positioned between the electrically conductive polysilicon layer 128A of a first nMOS transistor structure and 2 buried source/drain regions 134A and 134B. The buried source/drain regions 134A and 134B form interchangeable source and drain regions of the first NMOS transistor structure. The first ONO dielectric structure includes the oxide layer 122A, the nitride layer 124A, and the oxide layer 126A.

Similarly, the other illustrated localized trapped charge memory cell structure includes a second ONO dielectric structure positioned between the electrically conductive polysilicon layer 128B of a second NMOS transistor structure and 2 buried source/drain regions 134B and 134C. The buried source/drain regions 134B and 134C form interchangeable source and drain regions of the second nMOS transistor structure. The second ONO dielectric structure includes the oxide layer 122B, the nitride layer 124B, and the oxide layer 126B.

The buried source/drain regions 134A, 134B, and 134C form bit lines of the 2 illustrated localized trapped charge memory cell structures. The electrically conductive layer 142 is in electrical contact with the upper surfaces of the polysilicon layers 128A and 128B, and may be patterned to form a word line connected to both the illustrated localized trapped charge memory cell structures.

Figure 1B:
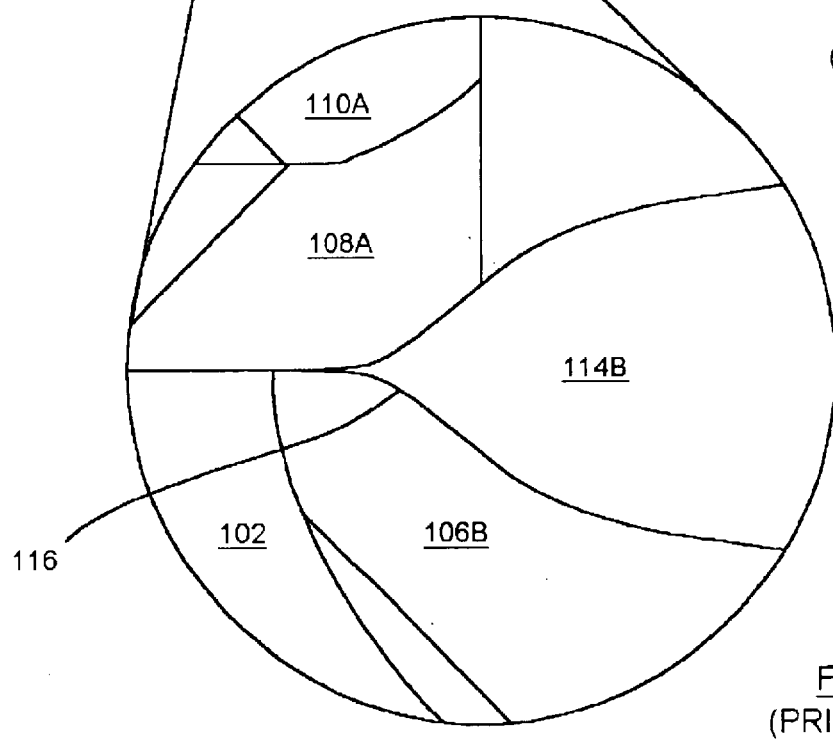
FIG. 1B is a magnified view of a portion of FIG. 1A illustrating a pointed bird's beak structure of an oxide layer adjacent to the localized trapped charge memory cell structure, wherein the bird's beak structure extends a significant distance under a component stack of the localized trapped charge memory cell structure.
Figure 9B:
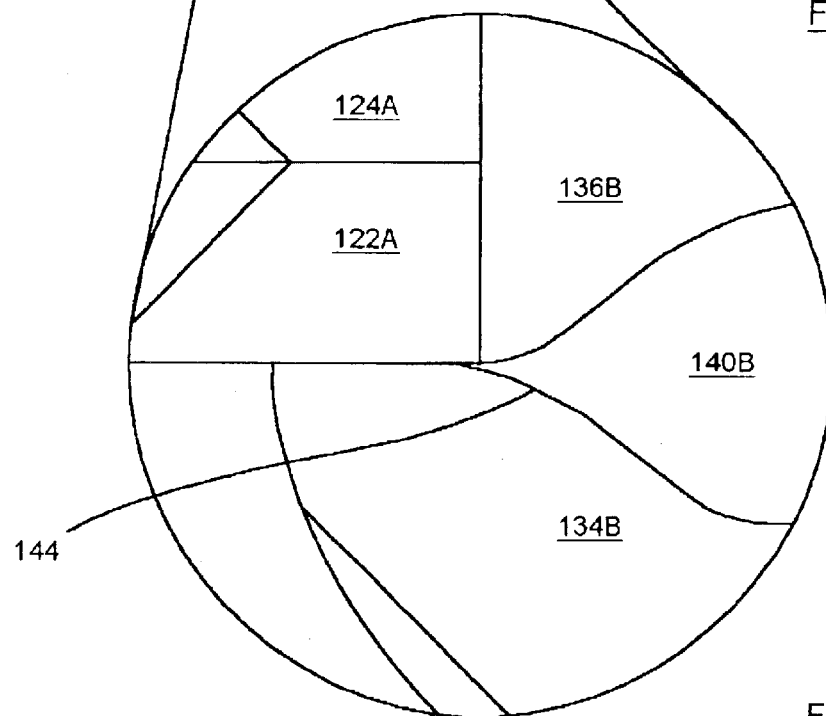
FIG. 9B is a magnified view of a portion of FIG. 9A illustrating a pointed bird's beak structure of one of the multiple oxide layers adjacent to one of the two localized trapped charge memory cell structures, wherein the bird's beak structure does not extend a significant distance under a component stack of the localized trapped charge memory cell structure.

FIG. 9B is a magnified view of a portion of FIG. 9A where the oxide layer 122A, the buried source/drain region 134B, and the oxide layer 1401B meet. As shown in FIG. 9B, a pointed bird's beak structure 144 is formed at an outer edge of the oxide layer 140B where the oxide layer 122A, the buried source/drain region 134B, and the oxide layer 140B meet. Referring back to FIG. 1B, the bird's beak structure 116 formed using the known method extends a significant distance under the component stack of the localized trapped charge memory cell structure, between the oxide layer 108A and the buried source/drain region 106B. In FIG. 9B, however, the bird's beak structure 144 does not extend a significant distance under the component stack of the localized trapped charge memory cell structure, between the oxide layer 122A and the buried source/drain region 134B. As a result, data retention time and/or the endurance of the corresponding portion of the localized trapped charge memory cell structure of FIGS. 9A–9B can be improved over the localized trapped charge memory cell structure of FIGS. 1A–1B. This may be characterized as better buried drain-gate oxide integration performance.

In view of the forgoing, it will be understood by those skilled in the art that the methods of the present invention can facilitate formation of read only memory devices, and in particular read only memory devices exhibiting localized charge trapping, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method for forming at least one non-volatile memory cell, comprising:

forming a component stack of the at least one non-volatile memory cell, wherein the component stack comprises an electro trapping structure free of conductive layers and contacting a substrate;

forming a dielectric layer over the component stack;

removing a portion of the dielectric layer such that a remainder of the dielectric layer exists substantially along sidewalls of the component stack;

forming an oxide layer over a bit line existing the substrate adjacent to the component stack; and forming a first electrically conductive layer over the component stack and the oxide layer.

2. The method as recited in claim 1, wherein the forming of an oxide layer over a bit line comprises growing an oxide layer over a bit line existing in the substrate adjacent to the component stack.

3. The method as recited in claim 1, wherein the remainder of the dielectric layer substantially prevents the oxide layer from extending under the component stack.

4. The method as recited in claim 1, wherein the electron trapping structure comprises a layer of silicon nitride.

5. The method as recited in claim 4, wherein the component stack further comprises a first dielectric layer and a second dielectric layer, and wherein the layer of silicon nitride is interposed between the first and second dielectric layers.

6. The method as recited in claim 5, wherein the component stack further comprises a second electrically conductive layer, and wherein the electron trapping structure is positioned between the second electrically conductive layer and the surface of the substrate.

7. The method as recited in claim 1, wherein the forming of a component stack comprises:

forming a first oxide layer, a nitride layer, a second oxide layer, and a second electrically conductive layer on a surface of a substrate in that order;

forming a patterned photoresist layer on the second electrically conductive layer; and using the patterned photoresist layer as a mask to pattern the second electrically conductive layer, the second oxide layer, the nitride layer, and the first oxide layer.

8. The method as recital in claim 1, wherein the at least one non-volatile memory cell comprises a localized trapped charge memory cell structure.

9. The method as recited in claim 1, wherein the at least one non-volatile memory cell comprises a plurality of localized trap charge memory cell structures.

10. A method for forming at least one non-volatile memory cell, comprising:

forming a first oxide layer, a nitride layer, a second oxide layer, and a first electrically conductive layer directly on a surface of a substrate in that order;

forming a patterned photoresist layer on the first electrically conductive layer;

using the patterned photoresist layer as an etching mask to form a component stack of the at least one non-volatile memory cell on the surface of the substrate;

using the patterned photoresist layer as a doping mask to form a bit line in the substrate adjacent to the component stack;

removing the patterned photoresist layer;

forming a dielectric layer over the component stack;

removing a portion of the dielectric layer such that a remainder of the dielectric layer exists substantially along sidewalls of the component stack;

forming an oxide layer over the bit line; and forming an electrically conductive layer over the component stack and the oxide layer.

11. The method as recited in claim 10, wherein the forming of an oxide layer over the bit line comprises growing an oxide layer over the bit line.

12. The method as recited in claim 10, wherein the remainder of the dielectric layer substantially prevents the oxide layer from extending under the component stack.

13. The method as recited in claim 10, wherein the nitride layer comprises silicon nitride and forms an electro rapping layer.

14. The method as recited in claim 10, wherein the using of the patterned photoresist layer as an etching mask and the using of the patterned photoresist layer as a doping mask comprise:

using the patterned photoresist layer as an etching mask to pattern the first electrically conductive layer, the second oxide layer, and the nitride layer;

using the patterned photoresist layer as a doping mask to selectively introduce dopant atoms into the surface of substrate; and using the patterned photoresist layer as au etching mask to pattern the first oxide layer.

15. The method as recited in claim 10, wherein the at least one non-volatile memory cell comprises a localized trapped charge memory cell structure.

16. The method as recited in claim 10, wherein the at least one non-volatile memory cell comprises a plurality localized trapped charge memory cell structures.

* * * * *